US010600776B2

(12) United States Patent
Lai et al.

(10) Patent No.: US 10,600,776 B2
(45) Date of Patent: Mar. 24, 2020

(54) DEVICE AND METHOD FOR ELECTROSTATIC DISCHARGE (ESD) PROTECTION

(71) Applicant: NXP B.V., Eindhoven (NL)

(72) Inventors: Da-Wei Lai, Nijmegen (NL); Wei-Jhih Tseng, Nijmegen (NL)

(73) Assignee: NXP B.V., Eindhoven (NL)

( * ) Notice: Subject to any disclaimer, the term of this patent is extended or adjusted under 35 U.S.C. 154(b) by 262 days.

(21) Appl. No.: 15/441,566

(22) Filed: Feb. 24, 2017

(65) Prior Publication Data

US 2018/0247927 A1 Aug. 30, 2018

(51) Int. Cl.
*H02H 9/00* (2006.01)
*H01L 27/02* (2006.01)
*H02H 9/04* (2006.01)

(52) U.S. Cl.
CPC ........... *H01L 27/0262* (2013.01); *H02H 9/04* (2013.01)

(58) Field of Classification Search
CPC ............................. H01L 27/0262; H02H 9/04
USPC .................................................. 361/56, 111
See application file for complete search history.

(56) References Cited

U.S. PATENT DOCUMENTS 5,825,600 A * 10/1998 Watt .................... H01L 27/0251
361/56
2001/0025963 A1 10/2001 Tashiro et al.
2004/0201033 A1 * 10/2004 Russ .................... H01L 27/0262
257/107
2006/0244071 A1 11/2006 Kondo
2010/0172059 A1 7/2010 Chaine et al.
2010/0301418 A1 12/2010 Kim
2013/0050887 A1 2/2013 Fan et al.
2017/0069616 A1 * 3/2017 Cai ..................... H01L 27/0255

OTHER PUBLICATIONS

Chen, Wen-Yi et al; "Diode-Triggered Silicon-Controlled Rectifier With Reduced Voltage Overshoot for CDM ESD Protection"; IEEE Transactions on Device and Materials Reliability, vol. 12, No. 1; pp. 10-14 (Mar. 2012).
Mergens, Markus P.J. et al; "Diode-Triggered SCR (DTSCR) for RF-ESD Protection of BiCMOS SiGe HBTs and CMOS Ultra-Thin Gate Oxides"; SOFICS; International Electron Devices Meeting 2003; 6 pages (2003).
Cai, Xiaowu et al; "An Area-Efficient Clamp Based on Transmission Gate Feedback Technology for Power Rail Electrostatic Discharge Protection"; IEEE Electron Device Letters, vol. 36, No. 7; 3 pages (Jul. 2015).

(Continued)

*Primary Examiner* — Thienvu V Tran
*Assistant Examiner* — Lucy M Thomas

(57) ABSTRACT

Embodiments of an electrostatic discharge (ESD) protection device and a method for operating an ESD protection device are described. In one embodiment, an ESD protection device includes a first bipolar device connected to a first node, a second bipolar device connected to the first bipolar device and to a second node, and a metal-oxide-semiconductor (MOS) device connected to the first and second nodes and to the first and second bipolar devices and configured to shunt current in response to an ESD pulse received between the first and second nodes. The first bipolar device, the second bipolar device, and the MOS device are formed on a deep well structure. Other embodiments are also described.

20 Claims, 6 Drawing Sheets

(56) References Cited

OTHER PUBLICATIONS

Mergens, Markus P.J. et al; "Speed Optimized Diode-Triggered SCR (DTSCR) for RF ESD Protection of Ultra-Sensitive IC Nodes in Advanced Technologies"; IEEE Transactions on Device and Materials Reliability, vol. 5, No. 3, Sep. 2005; pp. 532-542.
Solaro, Yohann et al.; "Novel Back-Biased UTBB Lateral SCR for FDSOI ESD Protections"; IEEE, pp. 222-225; 2013.
Li, You et al.; "Design and Optimization of ESD Lateral NPN Device in 14nm FinFET SOI CMOS Technology"; IBM Semiconductor Research and Development Center, Essex Junction, VT 05452; 7 pages; 2015.

* cited by examiner

DEVICE AND METHOD FOR ELECTROSTATIC DISCHARGE (ESD) PROTECTION

Embodiments of the invention relate generally to electronic hardware and methods for operating electronic hardware, and, more particularly, to electrostatic discharge (ESD) protection devices and methods for providing ESD protection.

Electrostatic discharge is a sudden flow of electricity that can be caused by a buildup of static electricity. An ESD protection device can be used to shunt ESD current to prevent thermal damage in a device. For example, an ESD protection device can be integrated onto an electrical device, such as an integrated circuit (IC) chip, to provide a low impedance channel to prevent thermal damage to components of the electrical device. The operating characteristics of an ESD protection device (e.g., the ESD reaction time for activating the ESD protection device to shunt ESD current) can affect the performance of the ESD protection device.

SUMMARY

Embodiments of an ESD protection device and a method for operating an ESD protection device are described. In one embodiment, an ESD protection device includes a first bipolar device connected to a first node, a second bipolar device connected to the first bipolar device and to a second node, and a metal-oxide-semiconductor (MOS) device connected to the first and second nodes and to the first and second bipolar devices and configured to shunt current in response to an ESD pulse received between the first and second nodes. The first bipolar device, the second bipolar device, and the MOS device are formed on a deep well structure. Other embodiments are also described.

In an embodiment, the MOS device includes a gate terminal connected to the second node and a body connected to the first and second bipolar devices.

In an embodiment, the first bipolar device includes a first bipolar transistor, the second bipolar device includes a second bipolar transistor, the MOS device includes an NMOS transistor, and the deep well structure includes a deep N-well layer.

In an embodiment, the first and second bipolar transistors are of different types.

In an embodiment, the first bipolar transistor includes a PNP bipolar transistor, and the second bipolar transistor includes an NPN bipolar transistor.

In an embodiment, the NMOS transistor includes a gate terminal and a source terminal that are connected to an emitter of the NPN bipolar transistor and to the second node, a drain terminal that is connected to an emitter of the PNP bipolar transistor and to the first node, and a body that is connected to a collector of the PNP bipolar transistor and to a base of the NPN bipolar transistor.

In an embodiment, a base of the PNP bipolar transistor is connected to a collector of the NPN bipolar transistor.

In an embodiment, the base of the PNP bipolar transistor and the collector of the NPN bipolar transistor are connected to a third node.

In an embodiment, the emitter of the PNP bipolar transistor is formed on an N-doped region that is in contact with the deep N-well layer.

In an embodiment, the base of the PNP bipolar transistor is formed on an N-well that is in contact with the deep N-well layer.

In an embodiment, the gate terminal of the NMOS transistor is formed on a P-well that is in contact with the deep N-well layer.

In an embodiment, the deep N-well layer has a depth of around 1,600 micrometers.

In an embodiment, at least one of the first and second bipolar transistors acts as a diode in response to the ESD pulse.

In an embodiment, the MOS device and one of the first and second bipolar transistors act as a silicon controlled rectifier (SCR) in response to the ESD pulse.

In an embodiment, an ESD protection device includes a PNP bipolar transistor connected to a first node, an NPN bipolar transistor connected to the PNP bipolar transistor and to a second node, and an NMOS transistor connected to the first and second nodes, to the PNP bipolar transistor, and to the NPN bipolar transistor and configured to shunt current in response to an ESD pulse received between the first and second nodes. The PNP bipolar transistor, the NPN bipolar transistor, and the NMOS transistor are formed on a deep N-well structure such that the PNP bipolar transistor acts as a diode in response to the ESD pulse.

In an embodiment, the NMOS transistor includes a gate terminal and a source terminal that are connected to an emitter of the NPN bipolar transistor and to the second node, a drain terminal that is connected to an emitter of the PNP bipolar transistor and to the first node, and a body that is connected to a collector of the PNP bipolar transistor and to a base of the NPN bipolar transistor.

In an embodiment, a base of the PNP bipolar transistor is connected to a collector of the NPN bipolar transistor and to a third node.

In an embodiment, the emitter of the PNP bipolar transistor is formed on an N-doped region that is in contact with the deep N-well layer, the base of the PNP bipolar transistor is formed on an N-well that is in contact with the deep N-well layer, and the gate terminal of the NMOS transistor is formed on a P-well that is in contact with the deep N-well layer.

In an embodiment, the NMOS transistor and at least one of the PNP bipolar transistor and the NPN bipolar transistor act as an SCR in response to the ESD pulse.

In an embodiment, a method for operating an ESD protection device involves receiving an ESD pulse at the ESD protection device, in response to the ESD pulse, activating an integrated diode of the ESD protection device formed on a deep well structure, and in response to activating the integrated diode, conducting an ESD current from the ESD pulse using a MOS device of the ESD protection device.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
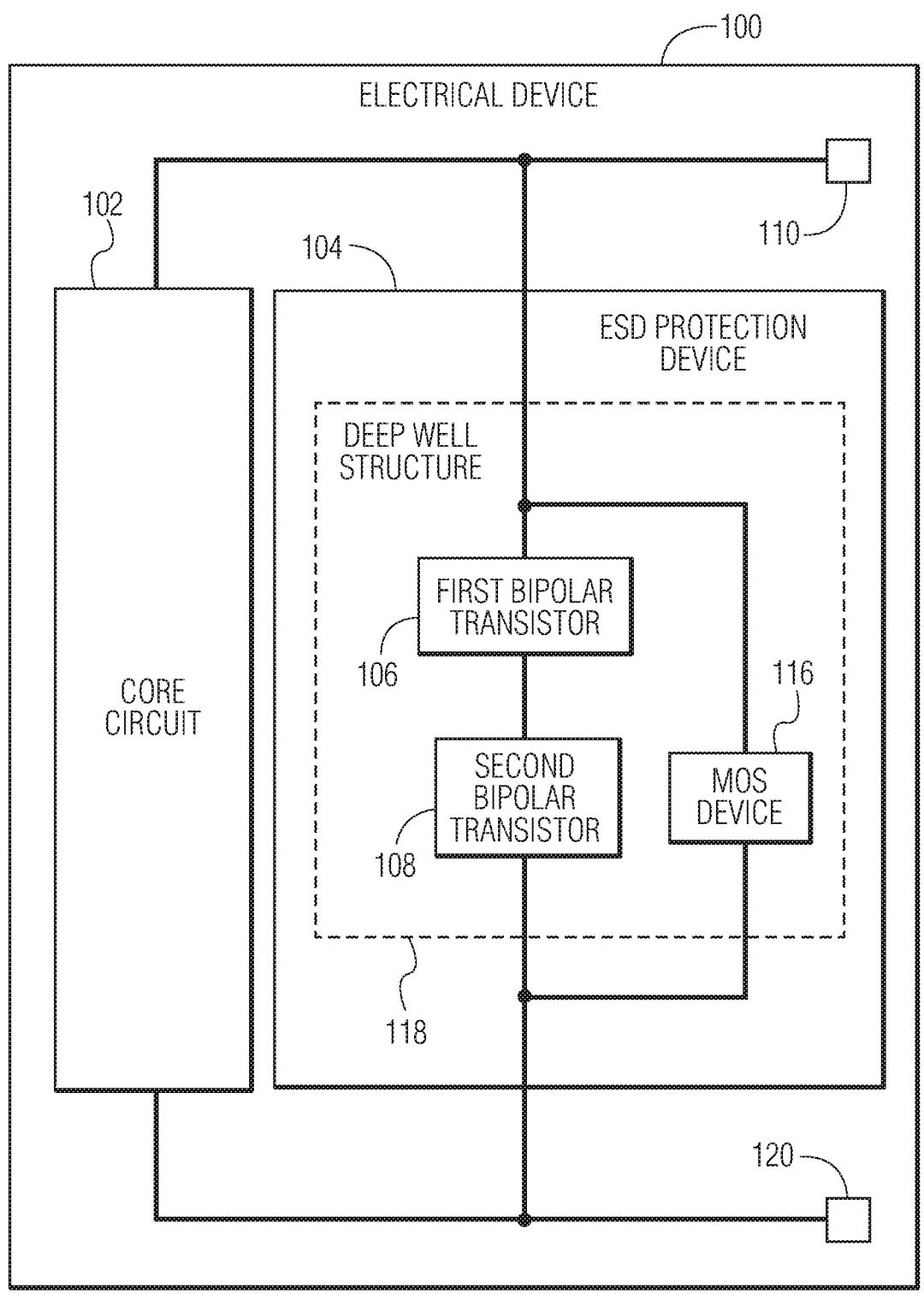
FIG. 1 is a schematic block diagram of an electrical device in accordance with an embodiment of the invention.

FIG. 1 is a schematic block diagram of an electrical device 100 in accordance with an embodiment of the invention. In the embodiment depicted in FIG. 1, the electrical device includes a core circuit 102 and an ESD protection device 104 that is used to protect the core circuit during an ESD event, which may be an ESD test or an actual ESD strike. The core circuit and the ESD protection device are both connected to first and second nodes 110, 120. The first and second nodes 110, 120 are coupled to different voltages. In some embodiments, the first node 110 is connected to a positive voltage and the second node 120 is connected to the ground or a voltage that is lower than the voltage at the first node 110 or vise versa. In an embodiment, the electrical device is an IC device and the first and second nodes are electrical terminals of the IC device, such as electrical contact pads or electrical contact pins.

The electrical device 100 can be used in various applications, such as automotive applications, communications applications, industrial applications, medical applications, computer applications, and/or consumer or appliance applications. In some embodiments, the electrical device is an IC device. For example, the electrical device can be implemented in a substrate, such as a semiconductor wafer or a printed circuit board (PCB). In some embodiments, the electrical device is included in a computing device, such as a smartphone, a tablet computer, a laptop, etc. For example, the electrical device may be included in a Near Field Communications (NFC) capable computing device. Although the electrical device is shown in FIG. 1 as including the core circuit 102 and the ESD protection device 104, in other embodiments, the electrical device may include additional circuit elements. For example, the electrical device may include a control circuit that is located in a low voltage domain and used to control the core circuit that is located in a high voltage domain.

The core circuit 102 is a device to be protected by the ESD protection device 104 in case of an ESD event, such as an ESD pulse received between the first and second nodes 110, 120. The core circuit typically includes one or more internal circuit components, such as transistors, capacitors, or diodes, which are susceptible to ESD strikes. Examples of the core circuit include, but are not limited to, microcontrollers, transceivers, and switching circuits, which can be used for, for example, in vehicle control or communications, identification, wireless communications, and/or lighting control. In an embodiment, the core circuit is packaged as a semiconductor IC chip.

The ESD protection device 104 protects the core circuit 102 during an ESD event, such as an ESD pulse received between the first and second nodes 110, 120. The ESD protection device can be used to protect a power supply domain of the electrical device 100. For example, the ESD protection device may be connected to a power supply rail of the electrical device and may shunt ESD current to protect the core circuit in response to an ESD pulse. The ESD protection device can be implemented by suitable semiconductor devices. In the embodiment depicted in FIG. 1, the ESD protection device includes a first bipolar device 106 connected to the first node 110, a second bipolar device 108 connected to the first bipolar device and to the second node 120, and a metal-oxide-semiconductor (MOS) device 116 connected to the first and second nodes and to the first and second bipolar devices and configured to shunt current in response to an ESD pulse received between the first and second nodes. In some embodiments, the first and second bipolar transistors are of different types. For example, one of the first and second bipolar transistors is a PNP bipolar transistor while the other one of the first and second bipolar transistors is an NPN bipolar transistor. Although the first bipolar device, the second bipolar device, and the MOS device are shown in FIG. 1 as being connected in a certain manner, in other embodiments, the first bipolar device, the second bipolar device, and the MOS device are connected differently from the embodiment depicted in FIG. 1. For example, the second bipolar device may be connected to the second node through one electrical connection while the MOS device may be connected to the second node through a different electrical connection.

In some embodiments, the first bipolar device 106, the second bipolar device 108, and the MOS device 116 are formed on a deep well structure 118. The deep well structure may be a deep N-doped well structure (i.e., a deep N-well structure) or a deep P-doped well structure (i.e., a deep P-well structure). In some embodiments, the deep well structure includes a doped layer that is located underneath an N-well or a P-well. For example, the deep well structure includes an N-doped layer that is located underneath an N-well. In an embodiment, the depth of the deep well structure into the substrate is more than the depth of a normal well structure (e.g., an N-well or a P-well). The depth of the deep well structure into the substrate may be around twice or three times the depth of a normal well structure. For example, the depth of the deep well structure may be around (e.g., ±5%) 1,600 μm while the depth of a normal well structure may be around (e.g., ±5%) 600 μm. The deep well structure can be biased to create a dedicated integrated diode and to enhance latch-up immunity of nearby circuitry. Because the first bipolar device, the second bipolar device, and the MOS device are formed on the deep well structure, the trigger voltage of the ESD protection device 104 can be boosted quickly and the ESD reaction time for activating the ESD protection device to shunt ESD current can be reduced. In particular, the first bipolar transistor and/or the second bipolar device 108 can act as a diode in response to an ESD pulse received between the first and second nodes 110, 120. The MOS device and the first and second bipolar transistors can act as a silicon controlled rectifier (SCR) in response to an ESD pulse received between the first and second nodes. In an example operation of the ESD protection device 104, in response to an ESD pulse received between the first and second nodes 110, 120, the first bipolar device 106 acts as an integrated diode, which is then forward biased. Once the integrated diode is forward biased, trigger current is injected into the MOS device 116, which activates the SCR formed by the MOS device and by the first and second bipolar devices and creates a trigger voltage event. In particular, once the trigger voltage is reached for the ESD protection circuit, the SCR can enter a conducting state (i.e., "on" state) and current is then shunted through the ESD protection circuit.

Compared to a capacitive ESD rail-clamp and a diode triggered SCR, the ESD protection device 104 can provide fast reacting ESD protection with a smaller substrate size, especially for low voltage (e.g., 1.2V-1.8V) applications. Consequently, the ESD protection device can be used in devices with limited substrate sizes, such as system on a chip (SoC) devices. For example, while a capacitive ESD rail-clamp can provide a fast reacting ESD protection and a low overshoot peak voltage, the size (i.e., physical dimensions) of the capacitive ESD rail-clamp may be too big for ESD protection in a SoC device. Compared to a capacitive ESD rail-clamp, the ESD protection device can be implemented with less substrate area while still providing a fast reacting ESD protection. Consequently, the ESD current capability per substrate area is higher than the ESD current capability per substrate area of a traditional capacitive trigger ESD rail-clamp. A diode triggered SCR can be used for low voltage applications. However, a diode triggered SCR can have high overshoot voltage under an ESD event. Compared to a capacitive ESD rail-clamp, the ESD protection device can provide a low overshoot peak voltage with fast reacting ESD protection.

Figure 2:
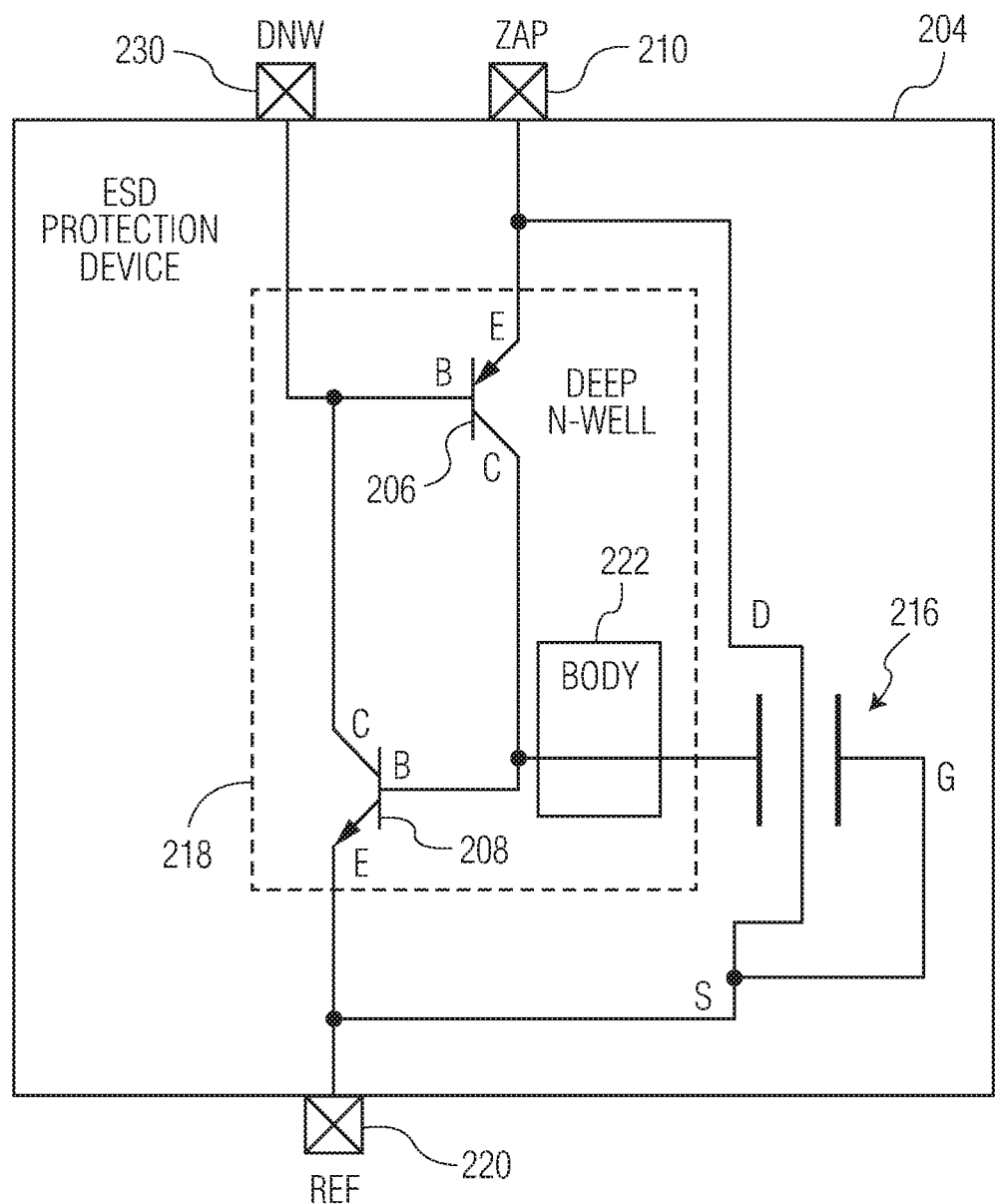
FIG. 2 depicts an embodiment of an ESD protection device of the electrical device depicted in FIG. 1.

FIG. 2 depicts an embodiment of the ESD protection device 104 depicted in FIG. 1. In the embodiment depicted in FIG. 2, an ESD protection device 204 includes a PNP bipolar transistor 206, an NPN bipolar transistor 208, and an NMOS transistor 216 that are all formed on a deep N-well 218. The gate terminal (G) and the source terminal (S) of the NMOS transistor are connected to the emitter (E) of the NPN bipolar transistor and to a reference voltage (REF) pin 220, which is connected to a reference voltage (e.g., ground). The drain terminal (D) of the NMOS transistor is connected to the emitter (E) of the PNP bipolar transistor and to a high voltage (ZAP) pin 210, which is connected to a positive voltage that is higher than the reference voltage at the REF pin. An ESD pulse may be applied to the ZAP pin 210 during an ESD event. The NMOS transistor also includes a floating body 222 that is connected to the collector (C) of the PNP bipolar transistor and to the base (B) of the NPN bipolar transistor. The base (B) of the PNP bipolar transistor is connected to the collector (C) of the NPN bipolar transistor and a deep N-well (DNW) pin 230. In some embodiments, the PNP bipolar transistor, the NPN bipolar transistor, and the NMOS transistor are located on a common substrate layer, such as a P-doped substrate layer. The ESD protection device 204 depicted in FIG. 2 is a possible implementation of the ESD protection device 104 depicted in FIG. 1. In particular, the PNP bipolar transistor, the NPN bipolar transistor, the NMOS transistor, and the deep N-well are embodiments of the first bipolar device 106, the second bipolar device 108, the MOS device 116, and the deep well structure 118 depicted in FIG. 1, respectively. However, the ESD protection device depicted in FIG. 1 can be implemented differently from the ESD protection device depicted in FIG. 2. For example, although the base (B) of the PNP bipolar transistor and the collector (C) of the NPN bipolar transistor are shown in FIG. 2 as being connected to the DNW pin 230, in other embodiments, the ESD protection device 204 may have only two pins (i.e., the ZAP pin and the REF pin). In these embodiments, the base (B) of the PNP bipolar transistor and the collector (C) of the NPN bipolar transistor are connected to the ZAP pin. In another example, at least one of the ZAP pin, the REF pin, and the DNW pin may be located at least partially within of the packaging of the ESD protection device 204.

In an example operation of the ESD protection device 204, during an ESD event (e.g., an ESD pulse received between the ZAP pin 210 and the REF pin 220), if the ESD voltage exceeds the trigger voltage of the ESD protection device, the PNP bipolar transistor 206 acts as an integrated diode and is forward biased. Once the integrated diode is forward biased, high current is rapidly injected into the floating body 222 of the NMOS transistor 216 to activate an SCR formed by the PNP bipolar transistor, the NPN bipolar transistor 208, and the NMOS transistor. Because the ESD protection device has an integrated diode and a floating base NMOS transistor, the breakdown time (e.g., the avalanche breakdown time) of the ESD protection device depicted in FIG. 2 is shorter than the breakdown time of a diode triggered SCR. Consequently, the ESD reaction time of the ESD protection device depicted in FIG. 1 is shorter than the ESD reaction time of a diode triggered SCR.

Figure 3:
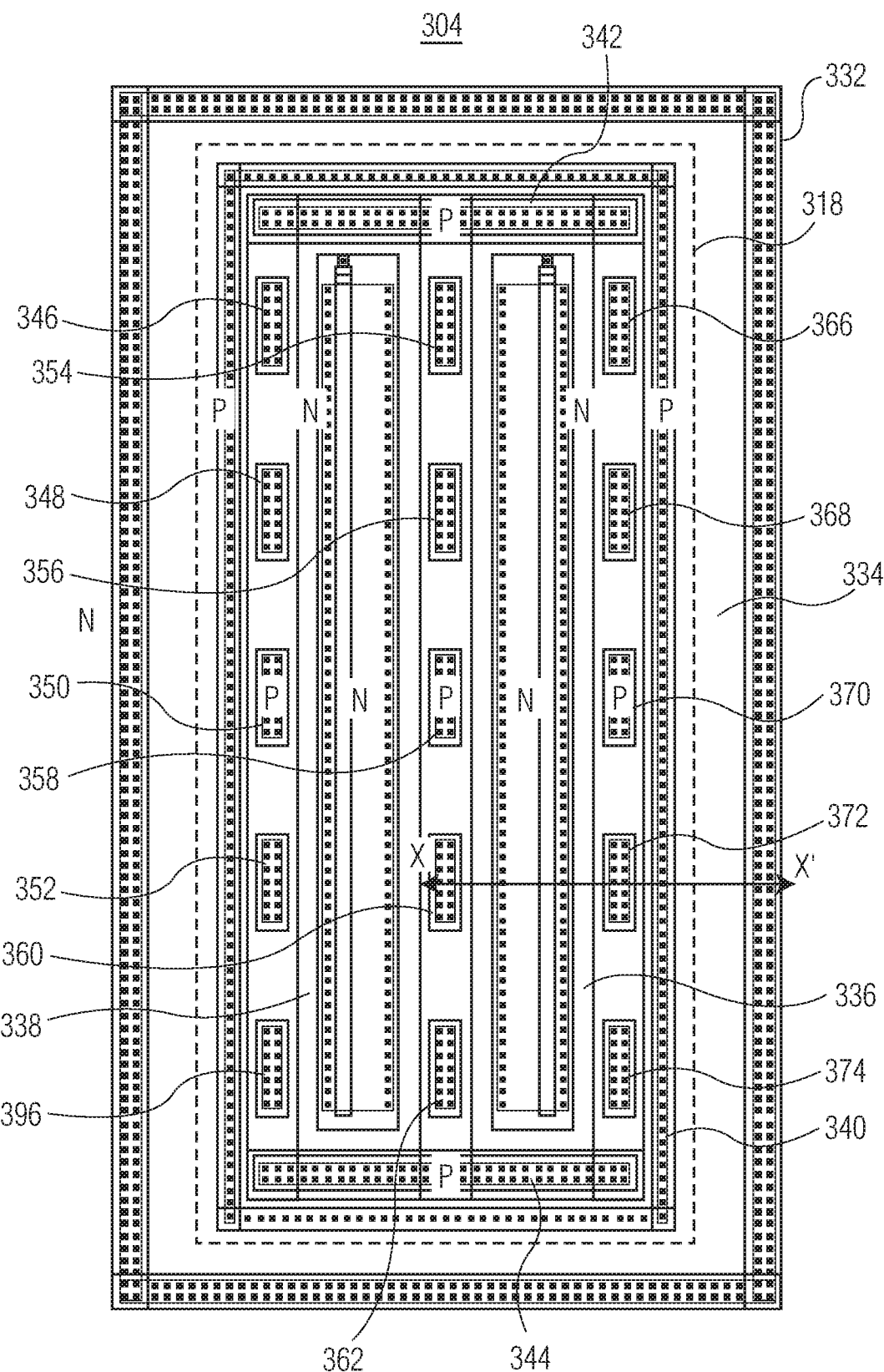
FIG. 3 depicts a top layout view of an ESD protection device in accordance with an embodiment of the invention.

FIG. 3 depicts a top layout view of an ESD protection device 304 in accordance with an embodiment of the invention. In the top layout view depicted in FIG. 3, the ESD protection device 304 includes an N-doped ring 332, a P-doped ring 340, P-doped strips 342, 344, N-doped structures 336, 338, and P-doped regions 346, 348, 350, 352, 354, 356, 358, 360, 362, 366, 368, 370, 372, 374, 396. The P-doped ring, the P-doped strips, the N-doped structures, and the P-doped regions are formed on a deep N-well layer 318. A trench 334 is located between the deep N-well 318 and the N-doped ring. The ESD protection device depicted in FIG. 3 is a possible implementation of the ESD protection device 204 depicted in FIG. 2. However, the ESD protection device depicted in FIG. 2 can be implemented differently from the layout depicted in FIG. 2. For example, although the ESD protection device is shown in FIG. 3 as including a certain number of N-doped sections and P-doped sections, in other embodiments, the ESD protection device may include more N-doped sections and/or more P-doped sections and/or less N-doped sections and/or less P-doped sections.

Figure 4:
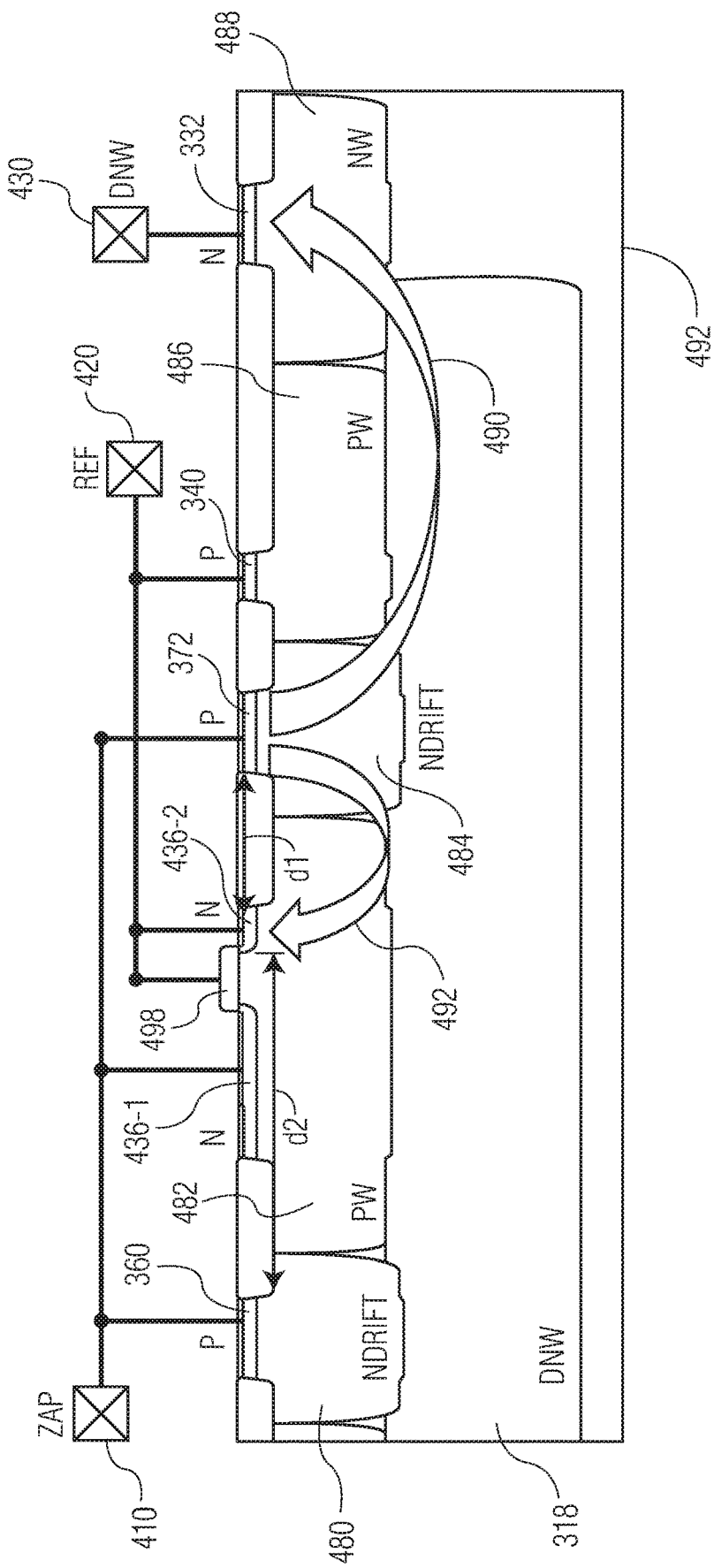
FIG. 4 depicts a cross sectional view of the ESD protection device 304 depicted in FIG. 3.

FIG. 4 depicts a cross sectional view of the ESD protection device 304 depicted in FIG. 3 at the location indicated in FIG. 3 by the dashed arrow from X to X'. In the X-X' cross sectional view, n-type drift regions (i.e., ndrift regions) 480 and 484, a first P-well (PW) region 482, and a second PW region 486 are formed on top of and in contact with the deep N-well layer 318. The deep N-well layer 318 is at least partially formed on top of and in contact with a substrate layer 492, which can be an epitaxial film, an epitaxial layer, or any other suitable substrate. An N-doped well (NW) 488, which is also referred to as the N-well, is formed at least partially on top of and in contact with of the deep N-well layer and the substrate layer 492. The first PW region 482 separates the ndrift regions 480 and 484 while the second PW region 486 separates the ndrift region 484 and the N-well. The P-doped region 360, which may be the emitter (E) of the PNP bipolar transistor 206 depicted in FIG. 2, is located on top of the ndrift region 480. N-doped regions 436-1, 436-2, which may be active regions, are located on top of the first PW region 482. A polysilicon (poly) gate 498, which may be the gate terminal (G) of the NMOS transistor 216 depicted in FIG. 2, is formed on top of the N-doped regions 436-1, 436-2 and the first PW region. In some embodiments, a contact pad (e.g., a metal layer) is formed on the poly gate 498. The P-doped region 372 is located on top of the ndrift region 484 while the P-doped ring 340 is located on top of the second PW region 486. The N-doped ring 332, which may be an active region, is formed on top of the N-well 488. The N-doped ring 332 may be the base (B) of the PNP bipolar transistor 206 depicted in FIG. 2. In the X-X' cross sectional view, the P-doped region 360, the N-doped region 436-1, and the P-doped region 372 are connected to a high voltage (ZAP) pin 410. The poly gate 498, the N-doped region 436-2, the P-doped region 372, and the P-doped ring 340 are connected to a reference voltage (REF) pin 420 while the N-doped ring 332 is connected to a deep N-well (DNW) pin 430. In some embodiments, a contact layer (e.g., a metal layer) is formed on each of the P-doped region 360, the N-doped regions 436-1, 436-2, the P-doped region 372, the P-doped ring 340, and the N-doped ring 332. In some embodiments, the P-doped region 372, the ndrift region 484, and the first PW region 482 form a PNP bipolar transistor. In some other embodiments, the P-doped region 360, the ndrift region 480, and the first PW region 482 form a PNP bipolar transistor. In some embodiments, the N-doped region 436-1, the first PW region 482, and the N-doped region 436-2 form an NMOS transistor. In some embodiments, the deep N-well layer 318, the first PW region 482, and the N-doped region 436-2 form an NPN bipolar transistor. The P-doped ring 340 and the second PW region 486 may be optional. In some embodiments, the ESD protection device 304 does not include the P-doped ring 340 and the second PW region 486.

In an example operation of the ESD protection device 304 depicted in FIGS. 3 and 4, during an ESD event (e.g., an ESD pulse received between the ZAP pin 410 and the REF pin 420), if the ESD voltage exceeds the trigger voltage of the ESD protection device, an integrated diode is forward biased and current flows through a current path 490 as illustrated in FIG. 4 and referred as the integrated diode path. Once the integrated diode is forward biased, an integrated SCR is activated and current flows through a current path 492 as illustrated in FIG. 4 and referred as the SCR path. For example, when the voltage at the P-doped region 372 is higher than a threshold voltage (e.g., the sum of the voltage at the DNW pin 430 and the voltage at the integrated diode), hole currents are generated from the integrated diode and diffused to lift-up the floating PW 482. Consequently, an NMOS transistor formed by the deep N-well layer 318, the first PW region 482, and the N-doped region 436-2 is turned on (i.e., conducting). When the voltage at the P-doped region 372 is higher than a threshold voltage (e.g., the sum of the voltage at the DNW pin and the voltage at the integrated diode), a PNP transistor formed by the P-doped region 360, the ndrift region 480, and the first PW region is turned on (i.e., conducting), which activates the integrated SCR. Compared to an ESD protection device without a deep N-well layer, the deep N-well layer of the ESD protection device depicted in FIGS. 3 and 4 creates an integrated diode during an ESD operation. Consequently, the breakdown time (e.g., the avalanche breakdown time) of the ESD protection device depicted in FIGS. 3 and 4 is shorter than the breakdown time of an ESD protection device without a deep N-well layer, such as a diode triggered SCR. Consequently, the ESD reaction time of the ESD protection device depicted in FIGS. 3 and 4 can be shorter than the ESD reaction time of an ESD protection device without a deep N-well layer. In some embodiments, the distance, "d2," between the P-doped region 360 and the N-doped region 436-2 and/or the distance, "d1," between the N-doped region 436-2 and the P-doped region 372 can be set to adjust the ESD reaction time of the ESD protection device depicted in FIGS. 3 and 4 and/or holding voltage at which a breakdown condition occurs in the ESD protection device depicted in FIGS. 3 and 4.

Figure 5:
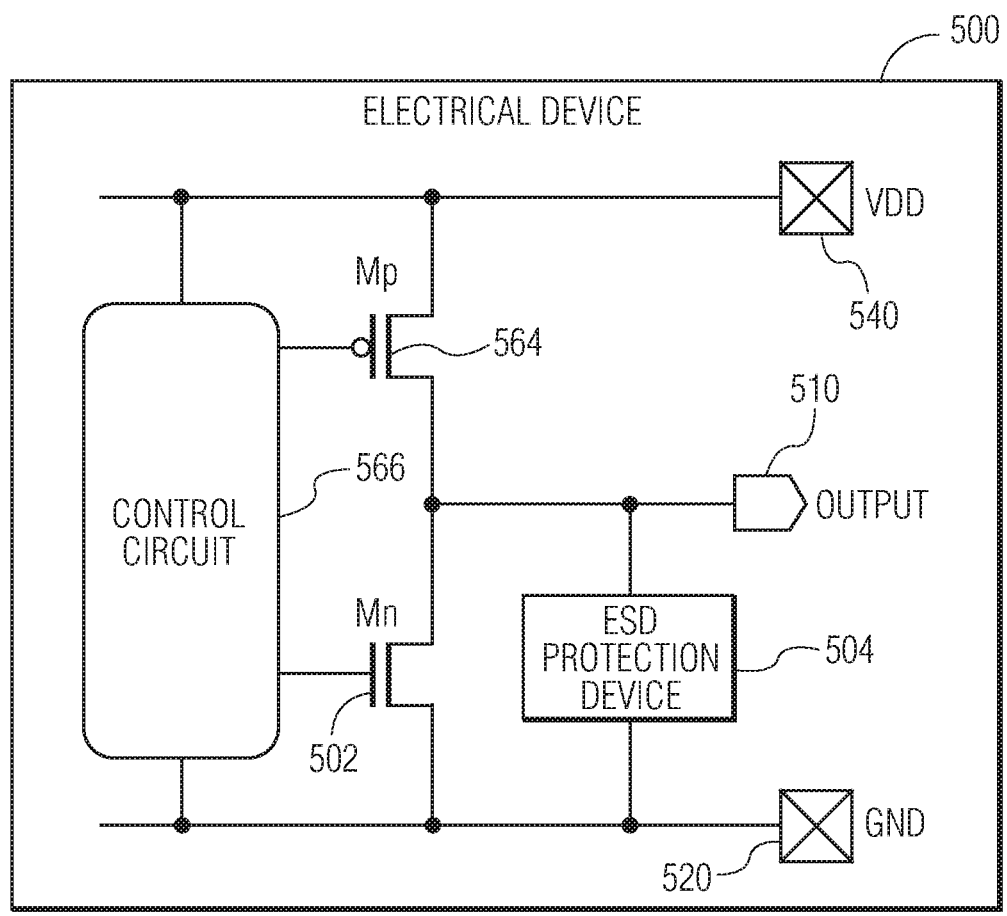
FIG. 5 depicts an embodiment of the electrical device depicted in FIG. 1.

The electrical device 100 depicted in FIG. 1 can be used in various applications. FIG. 5 depicts an embodiment of the electrical device 100 depicted in FIG. 1 in which an ESD protection device 504 is used to protect an output pin 510 during an ESD event, which may be an ESD test or an actual ESD strike. In the embodiment depicted in FIG. 5, an electrical device 500 includes a core circuit 502 that is implemented as an NMOS transistor, "Mn," the ESD protection device 504 that is used to protect the core circuit during an ESD event, a control circuit 566, and a PMOS transistor, "Mp," 564. The NMOS transistor, Mn, and the ESD protection device are both connected to the output pin 510 and to a ground, "GND," pin 520. The control circuit is connected to the GND pin and to a high voltage, "$V_{DD}$," pin 540 while the PMOS transistor, Mp, is connected to the $V_{DD}$ pin and to the output pin. The ESD protection device protects the NMOS transistor, Mn, from an ESD pulse received at the output pin. The electrical device depicted in FIG. 5 is a possible implementation of the electrical device depicted in FIG. 1. In particular, the ESD protection device 504 and the NMOS transistor, Mn, depicted in FIG. 5 are embodiments of the ESD protection device 104 and the core circuit 102 depicted in FIG. 1, respectively. However, the electrical device depicted in FIG. 1 can be implemented differently from the electrical device depicted in FIG. 5.

Figure 6:
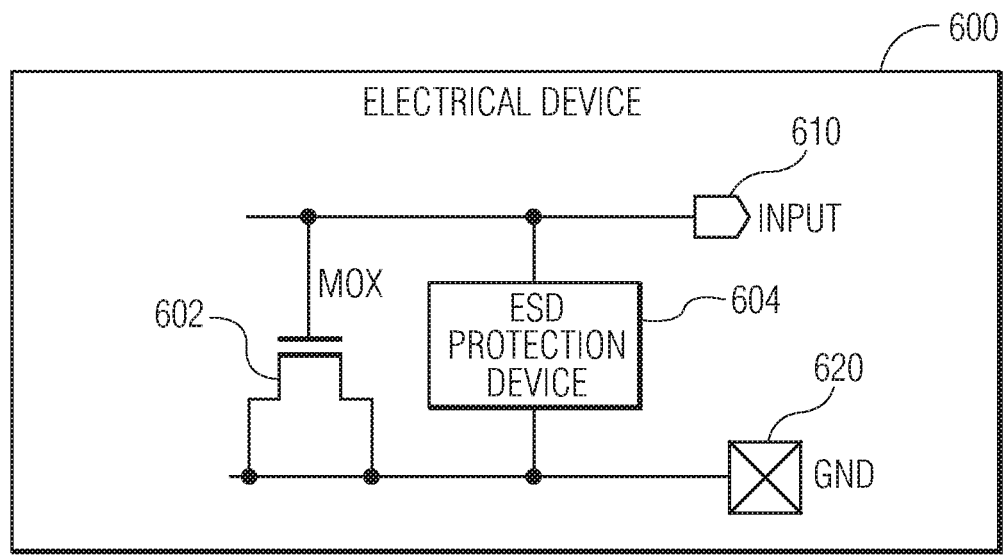
FIG. 6 depicts another embodiment of the electrical device depicted in FIG. 1.

FIG. 6 depicts an embodiment of the electrical device 100 depicted in FIG. 1 in which an ESD protection device 604 is used to protect an input pin 610 during an ESD event, which may be an ESD test or an actual ESD strike. In the embodiment depicted in FIG. 6, an electrical device 600 includes a core circuit 602 that is implemented as an NMOS transistor, "Mox," and the ESD protection device 604 that is used to protect the core circuit during an ESD event. The NMOS transistor, Mox, and the ESD protection device are both connected to the input pin 610 and to a ground, "GND," pin 620. The ESD protection device protects the NMOS transistor, Mox, from an ESD pulse received at the input pin. The electrical device depicted in FIG. 6 is a possible implementation of the electrical device depicted in FIG. 1. In particular, the ESD protection device 604 and the NMOS transistor, Mn, depicted in FIG. 6 are embodiments of the ESD protection device 104 and the core circuit 102 depicted in FIG. 1 depicted in FIG. 1, respectively. However, the electrical device depicted in FIG. 1 can be implemented differently from the electrical device depicted in FIG. 6.

Figure 7:
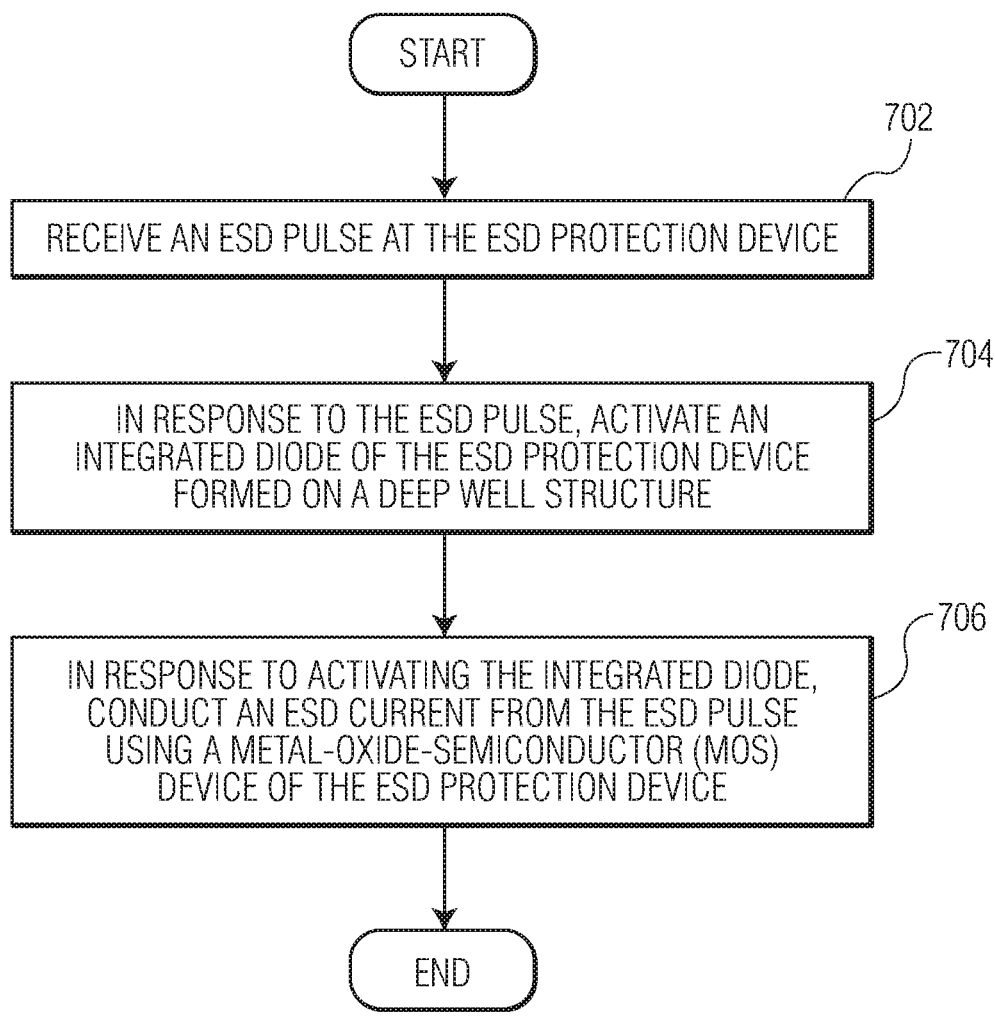
FIG. 7 is a process flow diagram that illustrates a method for operating an ESD protection device in accordance with an embodiment of the invention.

FIG. 7 is a process flow diagram that illustrates a method for operating an ESD protection device in accordance with an embodiment of the invention. At block 702, an ESD pulse is received at the ESD protection device. At block 704, in response to the ESD pulse, an integrated diode of the ESD protection device formed on a deep well structure is activated. At block 706, in response to operating the integrated diode, an ESD current is conducted from the ESD pulse using a MOS device of the ESD protection device. The ESD protection device may be the same as or similar to the ESD protection device 104 depicted in FIG. 1, the ESD protection device 204 depicted in FIG. 2, the ESD protection device 304 depicted in FIG. 3, the ESD protection device 504 depicted in FIG. 5, and/or the ESD protection device 604 depicted in FIG. 6.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
a first bipolar device connected to a first node;
a second bipolar device connected to the first bipolar device and to a second node; and
a metal-oxide-semiconductor (MOS) device connected to the first and second nodes and to the first and second bipolar devices and configured to shunt current in response to an ESD pulse received between the first and second nodes, wherein the first bipolar device, the second bipolar device, and the MOS device are formed on a deep well structure, wherein the deep well structure comprises a deep N-well layer that is formed on top of a substrate layer and below an N-well, and wherein the N-well is in contact with the deep N-well layer and in contact with the substrate layer.

2. The ESD protection device of claim 1, wherein the MOS device comprises a gate terminal connected to the second node and a body connected to the first and second bipolar devices.

3. The ESD protection device of claim 1, wherein the first bipolar device comprises a first bipolar transistor, wherein the second bipolar device comprises a second bipolar transistor, wherein the MOS device comprises an NMOS transistor.

4. The ESD protection device of claim 3, wherein the first and second bipolar transistors are of different types.

5. The ESD protection device of claim 3, wherein the first bipolar transistor comprises a PNP bipolar transistor, and wherein the second bipolar transistor comprises an NPN bipolar transistor.

6. The ESD protection device of claim 5, wherein the NMOS transistor comprises:
a gate terminal and a source terminal that are connected to an emitter of the NPN bipolar transistor and to the second node;
a drain terminal that is connected to an emitter of the PNP bipolar transistor and to the first node; and
a body that is connected to a collector of the PNP bipolar transistor and to a base of the NPN bipolar transistor.

7. The ESD protection device of claim 6, wherein a base of the PNP bipolar transistor is connected to a collector of the NPN bipolar transistor.

8. The ESD protection device of claim 7, wherein the base of the PNP bipolar transistor and the collector of the NPN bipolar transistor are connected to a third node.

9. The ESD protection device of claim 7, wherein the emitter of the PNP bipolar transistor is formed on an N-doped region that is in contact with the deep N-well layer.

10. The ESD protection device of claim 7, wherein the base of the PNP bipolar transistor is formed on the N-well that is in contact with the deep N-well layer.

11. The ESD protection device of claim 7, wherein the gate terminal of the NMOS transistor is formed on a P-well that is in contact with the deep N-well layer.

12. The ESD protection device of claim 3, wherein the deep N-well layer has a depth of around 1,600 micrometers.

13. The ESD protection device of claim 1, wherein at least one of the first and second bipolar transistors acts as a diode in response to the ESD pulse.

14. The ESD protection device of claim 13, wherein the MOS device and one of the first and second bipolar transistors act as a silicon controlled rectifier (SCR) in response to the ESD pulse.

15. An electrostatic discharge (ESD) protection device, the ESD protection device comprising:
a PNP bipolar transistor connected to a first node;
an NPN bipolar transistor connected to the PNP bipolar transistor and to a second node; and
an NMOS transistor connected to the first and second nodes, to the PNP bipolar transistor, and to the NPN bipolar transistor and configured to shunt current in response to an ESD pulse received between the first and second nodes, wherein the PNP bipolar transistor, the NPN bipolar transistor, and the NMOS transistor are formed on a deep N-well structure such that the PNP bipolar transistor acts as a diode in response to the ESD pulse, wherein the deep well structure comprises a deep N-well layer that is formed on top of a substrate layer and below an N-well, and wherein the N-well is in contact with the deep N-well layer and in contact with the substrate layer.

16. The ESD protection device of claim 15, wherein the NMOS transistor comprises:
a gate terminal and a source terminal that are connected to an emitter of the NPN bipolar transistor and to the second node;
a drain terminal that is connected to an emitter of the PNP bipolar transistor and to the first node; and
a body that is connected to a collector of the PNP bipolar transistor and to a base of the NPN bipolar transistor.

17. The ESD protection device of claim 16, wherein a base of the PNP bipolar transistor is connected to a collector of the NPN bipolar transistor and to a third node.

18. The ESD protection device of claim 17, wherein:
the emitter of the PNP bipolar transistor is formed on an N-doped region that is in contact with the deep N-well layer;
the base of the PNP bipolar transistor is formed on the N-well that is in contact with the deep N-well layer; and
the gate terminal of the NMOS transistor is formed on a P-well that is in contact with the deep N-well layer.

19. The ESD protection device of claim 18, wherein the NMOS transistor and at least one of the PNP bipolar transistor and the NPN bipolar transistor act as a silicon controlled rectifier (SCR) in response to the ESD pulse.

20. A method for operating an electrostatic discharge (ESD) protection device, the method comprising:
receiving an ESD pulse at the ESD protection device;
in response to the ESD pulse, activating an integrated diode of the ESD protection device formed on a deep well structure, wherein the deep well structure comprises a deep N-well layer that is formed on top of a substrate layer and below an N-well, and wherein the N-well is in contact with the deep N-well layer and in contact with the substrate layer; and
in response to activating the integrated diode, conducting an ESD current from the ESD pulse using a metal-oxide-semiconductor (MOS) device of the ESD protection device.

* * * * *